(12) United States Patent
Chen et al.

(10) Patent No.: US 8,221,601 B2
(45) Date of Patent: Jul. 17, 2012

(54) MAINTAINABLE SUBSTRATE CARRIER FOR ELECTROPLATING

(75) Inventors: Chen-An Chen, Milpitas, CA (US);
Emmanuel Chua Abas, Laguna (PH);
Edmundo Anida Divino, Cavite (PH);
Jake Randal G. Ermita, Laguna (PH);
Jose Francisco S. Capulong, Laguna (PH); Arnold Villamor Castillo, Batangas (PH); Diana Xiaobing Ma, Saratoga, CA (US)

(73) Assignee: SunPower Corporation, San Jose, CA (US)

( * ) Notice: Subject to any disclaimer, the term of this patent is extended or adjusted under 35 U.S.C. 154(b) by 152 days.

(21) Appl. No.: 12/889,232

(22) Filed: Sep. 23, 2010

(65) Prior Publication Data

US 2012/0073976 A1 Mar. 29, 2012

(51) Int. Cl.
*C25D 17/08* (2006.01)
*C25D 17/06* (2006.01)
*C25B 9/02* (2006.01)
*C25B 9/04* (2006.01)

(52) U.S. Cl. ......... 204/297.06; 204/297.01; 204/297.12; 204/297.1; 204/297.14; 204/297.09; 205/80; 205/118; 205/122; 205/125; 211/41.17; 269/37

(58) Field of Classification Search ............... 204/286.1, 204/287, 297.01, 297.06, 297.12, 297.1, 204/297.14; 211/41.17; 269/37; 205/80, 205/118, 122, 125
See application file for complete search history.

(56) References Cited

U.S. PATENT DOCUMENTS

| | | | |
|---|---|---|---|
| 3,864,789 A | | 2/1975 | Leitner |
| 4,297,197 A | * | 10/1981 | Salman ................. 204/297.06 |
| 4,362,353 A | * | 12/1982 | Cobaugh et al. ............. 439/825 |
| 4,796,157 A | * | 1/1989 | Ostrem ......................... 361/717 |
| 4,987,659 A | | 1/1991 | Grandis |
| 5,309,605 A | | 5/1994 | Sato |
| 5,442,142 A | * | 8/1995 | Hayashi ........................ 174/250 |
| 6,269,993 B1 | | 8/2001 | Ebejer et al. |
| 7,172,184 B2 | * | 2/2007 | Pavani et al. .................. 269/37 |
| 7,339,110 B1 | | 3/2008 | Mulligan et al. |
| RE40,218 E | * | 4/2008 | Landau ........................... 205/96 |
| 7,957,156 B2 | * | 6/2011 | Palomo ......................... 361/779 |
| 2003/0024082 A1 | | 2/2003 | Seymour |
| 2004/0185237 A1 | * | 9/2004 | Kawate ........................ 428/216 |
| 2005/0061665 A1 | | 3/2005 | Pavani et al. |
| 2006/0272951 A1 | | 12/2006 | Schmergel et al. |
| 2007/0151599 A1 | | 7/2007 | Cousins |
| 2008/0248596 A1 | | 10/2008 | Das et al. |

(Continued)

OTHER PUBLICATIONS

International Search Report for Application No. PCT/US2011/043576, Oct. 21, 2011, 2 sheets.

*Primary Examiner* — Bruce Bell
(74) *Attorney, Agent, or Firm* — Okamoto & Benedicto LLP

(57) ABSTRACT

One embodiment relates to a substrate carrier for use in electroplating a plurality of substrates. The carrier includes a non-conductive carrier body on which the substrates are placed and conductive lines embedded within the carrier body. A plurality of conductive clip attachment parts are attached in a permanent manner to the conductive lines embedded within the carrier body. A plurality of contact clips are attached in a removable manner to the clip attachment parts. The contact clips hold the substrates in place and conductively connecting the substrates with the conductive lines. Other embodiments, aspects and features are also disclosed.

20 Claims, 17 Drawing Sheets

U.S. PATENT DOCUMENTS

| | | |
|---|---|---|
| 2009/0009936 A1 | 1/2009 | Neu et al. |
| 2009/0078290 A1 | 3/2009 | Addicks et al. |
| 2009/0134034 A1 | 5/2009 | Pass |
| 2012/0073974 A1* | 3/2012 | Abas et al. ............ 205/80 |
| 2012/0073975 A1* | 3/2012 | Ganti ............ 205/80 |
| 2012/0073976 A1* | 3/2012 | Chen et al. ............ 205/80 |

* cited by examiner

MAINTAINABLE SUBSTRATE CARRIER FOR ELECTROPLATING

STATEMENT OF FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

CROSS-REFERENCE TO RELATED APPLICATIONS

The present application is related to commonly-owned U.S. patent application Ser. No. 12/889,219, entitled "Non-Permeable Substrate Carrier for Electroplating," filed on even date herewith by Emmanuel Abas; Chen-An Chen; Diana Ma; and Kalyana Ganti. The present application is also related to commonly-owned U.S. patent application Ser. No. 12/889,228, entitled "Sealed Substrate Carrier for Electroplating," filed on even date herewith by Kalyana Ganti.

BACKGROUND

1. Field of Art

This disclosure relates generally to the field of electroplating. More particular, this disclosure relates to a carrier for use in electroplating substrates.

2. Description of the Related Art

Electroplating is a deposition technique that may be used to form a metal layer on a substrate. In some electroplating processes, the anode may be made out of the metal to be deposited, and the cathode may be the substrate to be plated. Both the anode and the cathode are immersed in an electrolyte solution, and a voltage is applied across the anode and cathode so that an electrical current flows between them. This causes oxidation of the metal at the anode so that ions of the metal are dissolved in the solution. This also causes reduction of the metal ions at the cathode so that a layer of the metal is deposited onto the substrate. In other electroplating processes, the solution may have ions of the metal to be plated, and the anode may be a non-consumable anode. In this case, the metal ions may be periodically replenished in the bath.

In order to efficiently electroplate a large number of substrates, a carrier may be used to hold multiple substrates and to apply electrical voltages to those substrates during the electroplating process. The carrier may be used to transfer the substrates between different chemical baths and also to safely handle them during rinsing and drying steps.

The present application discloses improved substrate carriers for electroplating.

SUMMARY

One embodiment relates to a substrate carrier for use in electroplating a plurality of substrates. The carrier includes a non-conductive carrier body on which the substrates are placed and conductive lines embedded within the carrier body. A plurality of conductive clip attachment parts are attached in a permanent manner to the conductive lines embedded within the carrier body. A plurality of contact clips are attached in a removable manner to the clip attachment parts. The contact clips hold the substrates in place and conductively connecting the substrates with the conductive lines.

Another embodiment relates to a method of electroplating substrates. The substrates are clipped to a substrate carrier. The substrate carrier comprises a non-conductive carrier body, conductive lines embedded within the carrier body, conductive clip attachment parts are attached in a permanent manner to the conductive lines, and contact clips attached in a removable manner to the clip attachment parts. The substrate carrier is mounted onto a mechanical arm, and a voltage is applied to the substrates via the contact clips. The substrate carrier with the substrates clipped thereon is dipped into an electroplating bath, and the substrates are unclipped from the substrate carrier when the electroplating is complete.

Another embodiment relates to a method of manufacturing a substrate carrier for use in electroplating a plurality of substrates. First and second non-conductive plates are formed, each plate having an inner face and an outer face. Metal lines are provided and clip attachment parts are conductively attached to the metal lines in a permanent manner. The inner faces of the plates are bonded with the metal lines and clip attachment parts embedded therein, and openings are formed from the outer faces to access the clip attachment parts.

Other embodiments, aspects and features are also disclosed in the present application.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
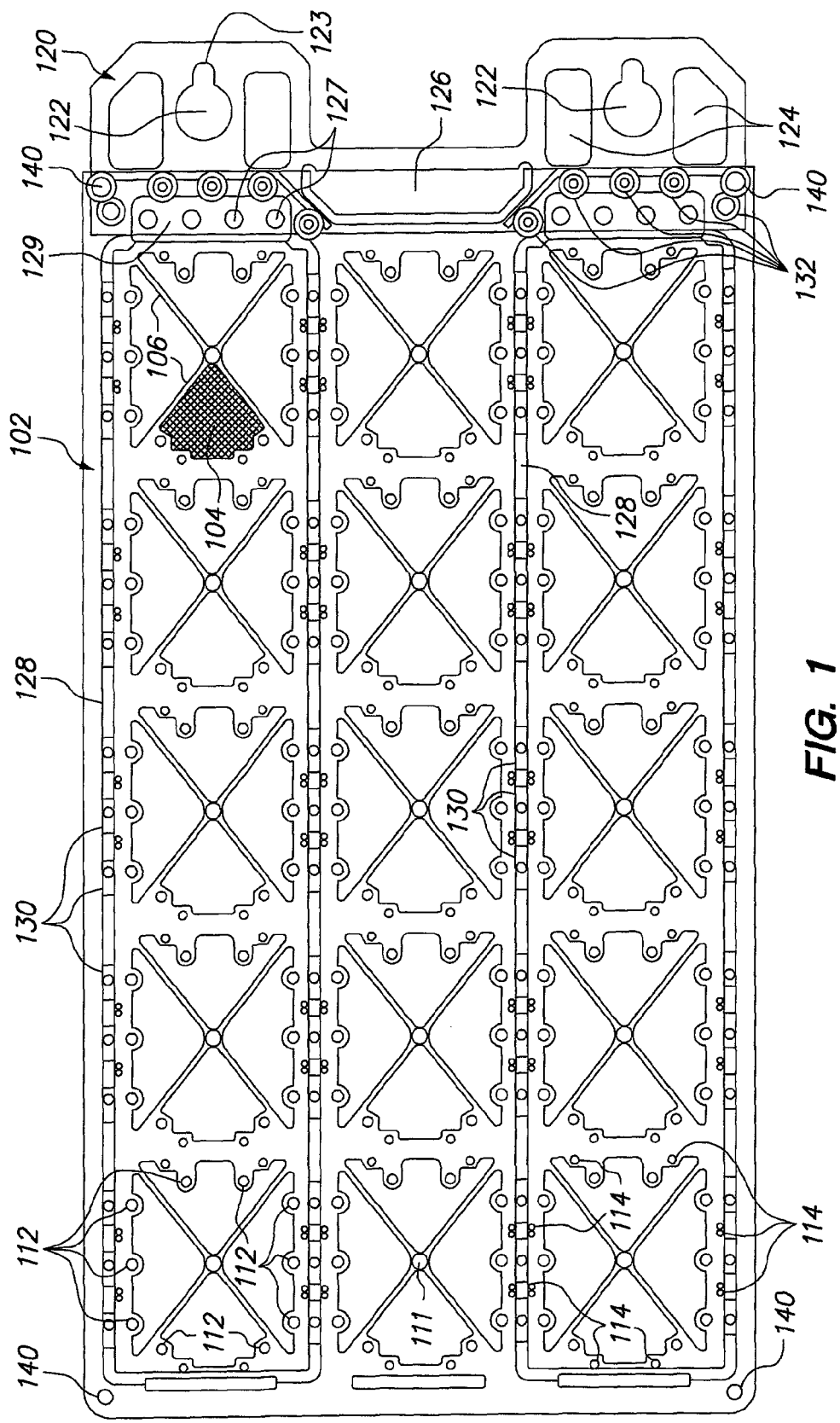
FIG. 1 is a planar view of an inner face of a non-conductive plate for a non-permeable substrate carrier in accordance with an embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Conventional substrate carriers for electroplating have problems that are difficult to diagnose and solve. One problem with conventional substrate carriers is that they sometimes break the substrates during loading of the substrates onto the carrier. Applicants have analyzed the breakages and have discovered that the breakages frequently occur in the vicinity of the metal clips used to hold the substrates to the carrier. Applicants have further analyzed these breakages and have determined that they are often due to a portion of the clip impacting the edge of the substrate when the clip is not fully in a "closed" position.

Another problem with conventional substrate carriers is that the plating of some of the substrates is frequently incomplete in that there is non-uniform coverage of the substrate. The positions of the incompletely-plated substrates in the carrier are not always the same and appear to be somewhat random. Applicants have analyzed the incompletely plated substrates and have discovered that the incompletely-plated "stain" is often at a bottom portion of the substrate. Applicants have determined that these "stains" are due to plating solution residue that becomes trapped at the bottom of the carrier pockets and is not rinsed out.

Other problems relate to a lack of durability of the carriers. In other words, mechanical breakages limit the useful lifespan of the conventional substrate carriers before repair or replacement is necessary. The contact clips frequently fail due to being broken or damaged, or having too low tension, or not contacting the substrate in the proper location. In addition, the pads on the carrier often break or crack. Moreover, the carrier body itself often cracks or breaks, and the copper conductors within the carrier often fail due to etching by the chemical baths. Applicants have determined that that contributing factors for breakage of the carrier body include overstacking of carriers during staging and mishandling of the carriers.

The present application discloses improved substrate carriers that provide solutions to one or more of the above-discussed problems.

In accordance with one embodiment of the invention, a substrate carrier is provided that does not have openings allowing solution to go from one side of the carrier to the other side. In other words, the substrate carrier is effectively continuous and non-permeable to the electrolyte solution. A conventional view is that such openings are advantageous in reducing the weight of the carrier and allowing the electrolyte solution to flow through from side to side. However, applicants have surprisingly found that a "flat" carrier body which is effectively continuous and non-permeable (without openings going through the body) has various advantages. First, applicants believe that the flat carrier body provides a sheeting action which assists in the complete removal of the electrolyte solution during rinsing. In addition, although the flat carrier body is conventionally thought to be substantially heavier (due to the lack of open space), applicants have designed a flat carrier body with internal cavities so as to substantially reduce its weight.

In accordance with another embodiment of the invention, a robust substrate carrier is provided which has improved adhesion between thermoplastic and metal layers. The improved adhesion results in a superior hermetic seal which prevents chemical solutions from prematurely corroding metal within the carrier. As disclosed herein, the adhesion problems may be solved or reduced by replacing a previous weak metal-to-thermoplastic surface bond interface with two strong bond interfaces. The two strong bond interfaces are an improved metal-to-thermoplastic surface bond interface (using a bonding technique which provides superior adhesion, such as injection molding, for example) and a thermoplastic-to-thermoplastic surface bond interface.

In accordance with another embodiment of the invention, a substrate carrier is provided which has reduced downtime due to component failures. The component failures may comprise, for example, failures of the clips which hold the substrates to be plated to the carrier. As disclosed herein, a substrate carrier may be configured such that clips and other components may be removably attached. This advantageously enables the carrier to be kept in service without the substantial downtime needed to repair more permanently attached components.

FIG. 1 is a planar view of an inner face 102 of a non-conductive (electrically-insulating) plate for a non-permeable substrate carrier in accordance with an embodiment of the invention. The non-conductive plate itself is electrically insulating. Also shown positioned on the inner face is a conductive assembly including an electrically-conductive bus bar 120 at a top of the carrier and conductive lines 128 going from the bus bar 120 towards the bottom of the carrier.

In this exemplary embodiment, the inner face 102 includes fifteen "X" shaped ribbing patterns 106, each X-shaped ribbing pattern 106 separating four pocket indentations 104. These pocket indentations 104 substantially reduce the weight of the plate.

In addition, shown at the center of the X-shaped ribbing pattern 106 is a center location 111 which corresponds to a center pad location 211 on the outer face 202 (see FIG. 2, which is described below). Also shown at a perimeter around each X-shaped ribbing pattern 106 are first perimeter locations 112 which correspond to perimeter pad locations 212 on the outer face 202 (see FIG. 2). Shown at slightly farther out perimeter around each X-shaped ribbing pattern 106 are second perimeter locations 114 which correspond to alignment peg locations 214 on the outer face 202 (see FIG. 2).

Further shown in FIG. 1 is a conductive assembly including a metal bus bar 120 coupled to metal lines 128. For example, the metal bus bar 120 may be machined stainless steel and the metal lines 128 may be copper lines. The metal bus bar 120 may be coupled to the metal lines 128 in an electrically-conductive manner by welding of a metal cover plate 129 (which may also be stainless steel, for example). Metal bushings may be welded in the bushing holes 127 to securely interconnect the plate 129 and a top portion 402 (see FIG. 4) of the metal lines 128. In addition, metal clipping pins 130 are attached to the metal lines 128 at either side of the X-shaped ribbing patterns 106. These metal clipping pins may be configured to allow removable clips to be attached onto the outer surface 202 of the carrier. Some of the metal clipping pins 130 are attached to metal lines 128 at an edge of the plate and others are attached to metal lines 128 in an interior of the plate.

The metal bus bar 120 is machined to have a plurality of openings. Two "keyhole" shaped openings 122 may be included to mount the carrier onto a mechanical work arm. The "keyhole" shape includes an alignment feature 123 which enables a more consistent alignment between the work arm and the carrier. On either side of each keyhole-shaped opening 122 may be a side opening 124. The side openings 124 advantageously reduce a weight of the metal bus bar 120. A handle opening 126 is provided at a top center location to facilitate manual holding of the carrier. The bus bar 120 may also include a series of bonding holes 132 to facilitate the secure attachment of a thermoplastic overcoat 602 (see FIG. 6, which is described below).

Also shown in FIG. 1 are dowel pin holes 140 at the corners of the carrier. These dowel pin holes 140 go through both the non-conductive plate and the metal bus bar 120 and may be used for the alignment of the carrier when it is loaded onto a table or loader.

Figure 2:
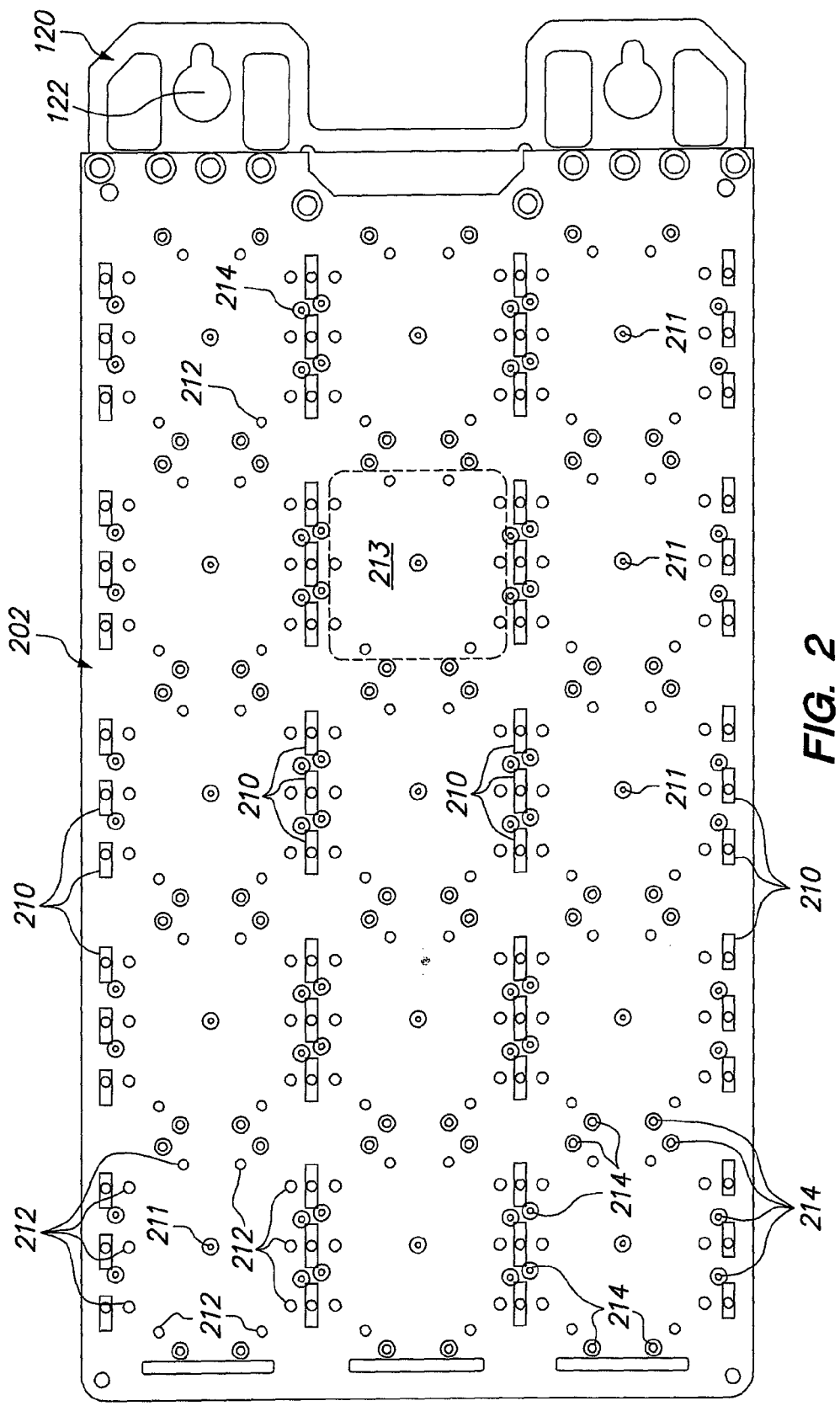
FIG. 2 is a planar view of an outer face of the non-conductive plate in accordance with an embodiment of the invention.

FIG. 2 is a planar view of an outer face 202 of the non-conductive plate in accordance with an embodiment of the invention. A portion of the conductive bus bar 120 is also shown. In this exemplary embodiment, the outer face 202 is designed to be substantially "flat" to reduce a tendency for electrolyte solution to remain trapped in corners and crevices of the carrier.

The outer face 202 includes fifteen center pad attachment points 211. Shown on a first perimeter around each center pad attachment point 211 are perimeter pad attachment points 212. These pad attachment points (211 and 212) may comprise, for example, mounting holes for removably attaching plastic pads.

Shown on a second perimeter around each center pad attachment point 211 are alignment peg attachment points 214. Points on the second perimeter are slightly farther out from the center point than points on the first perimeter. The peg attachment points 214 may comprise, for example, mounting holes for removably attaching plastic pegs.

Fifteen areas 213 for holding a substrate (such as a silicon wafer, for example) are present on the outer face 202 in this exemplary embodiment. Each substrate holding area 213 is surrounded by the alignment peg attachment points 214. The pad attachment points (211 and 212) are located within the substrate holding area 213 such that pads attached at those points provide spacing between the substrate and the surface of the outer face 202.

Further shown in FIG. 2 are clip attachment features 210. In accordance with an embodiment of the invention, each clip attachment feature may comprise a threaded outer surface 502 of a metal clipping pin (see FIG. 5B, described below). The clip attachment features are located on opposite sides of each substrate holding area 213. In the exemplary embodiment shown, the clip attachment features may be aligned in vertical columns, including clip attachment features 210 along each side of the plate and clip attachment features 210 between neighboring substrate holding areas 213 in an interior region of the plate.

Figure 3:
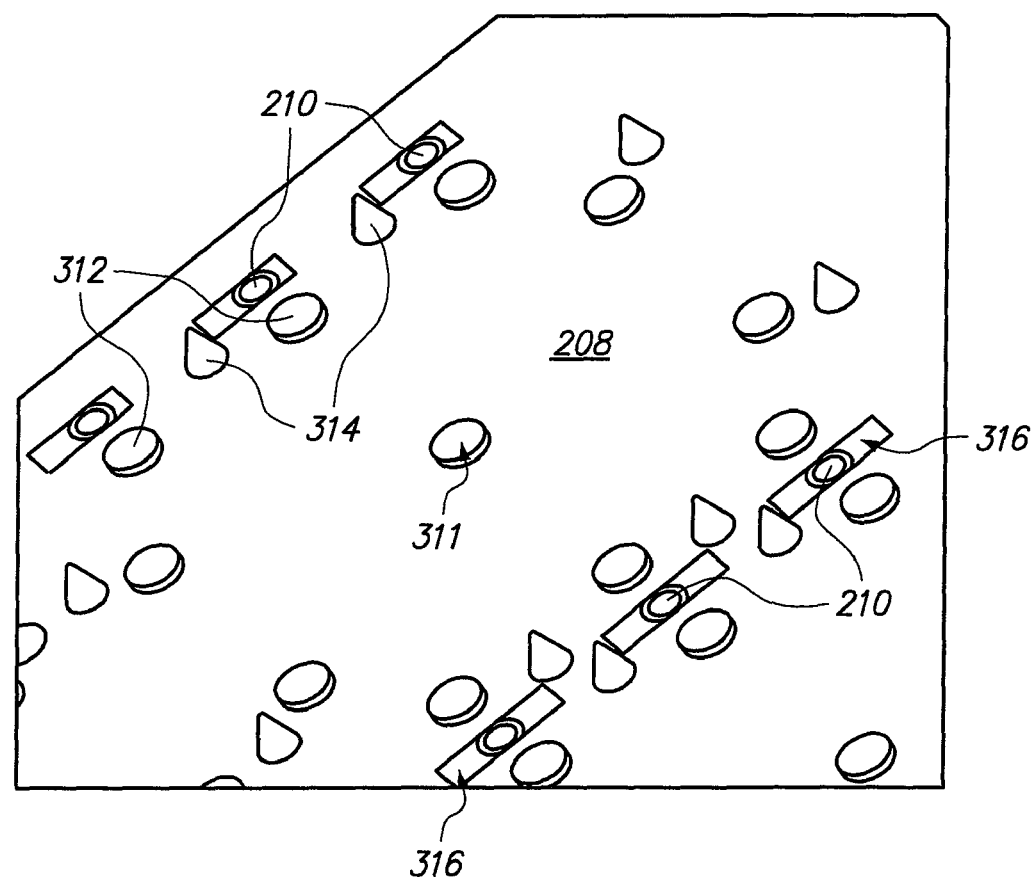
FIG. 3 is a perspective view of a substrate holding area the outer face of the non-conductive plate in accordance with an embodiment of the invention.

FIG. 3 is a perspective view of a substrate holding area 213 on the outer face 202 of the non-conductive plate in accordance with an embodiment of the invention. As shown, at a center of the substrate holding area 213 is a center pad 311 (attached to the center attachment point 211 shown in FIG. 2). Shown on a first perimeter around the center pad 311 are perimeter pads 312 that are removably attached to the perimeter attachment points 212. For example, the center and perimeter attachment points (211 and 212) may comprise insertion holes, and the pads (311 and 312) may be attached by inserting stubs on the underside of the pads into the insertion holes. The pads (310 and 311) may be are provided so as to advantageously create a rinsing space between the surface of the outer face 202 and the substrate to be plated. The pads (310 and 311) may be made of plastic and may be configured to be removable for ease of replacement when they become worn or damaged. In one implementation, the pads may have a flat surface that is in a "tear drop" shape.

Shown on a second perimeter around the center pad 311 are alignment pegs 314 that are removably attached to the alignment peg attachment points 214. (Points on the second perimeter are slightly farther out from the center pad 311 than points on the first perimeter.) For example, the peg attachment points 214 may comprise insertion holes, and the pegs 314 may be attached by inserting a stub at the bottom of each peg into an insertion hole. The pegs 314 have the dual functionalities of holding the substrate to be plated within the substrate holding space and protecting the clips from damage that may be caused by the substrate. The pegs 314 may be made out of plastic and may be configured to be removable for ease of replacement when they become worn or damaged. In one implementation, the pegs 314 may be tapered.

As further shown, on one side of the substrate holding area 213 is a first set of three clip attachment features 210, and on the other aide is a second set of three clip attachment features 210. The clip attachment features 210 may be configured such that electrically-conductive clips may be removably attached for ease of replacement when they become worn or damaged. The clip attachment features 210 form an electrically-conductive path between the conductive assembly (such as depicted in FIG. 4) and the electrically-conductive clips.

In addition, FIG. 3 depicts relief cuts 316 surrounding the clip attachment features 1210. These relief cuts 316 are recessed areas that facilitate proper positioning of a base of a clip assembly (for example, see base 1012 of clip assembly 1000 shown in FIGS. 10A and 10B).

Figure 4:
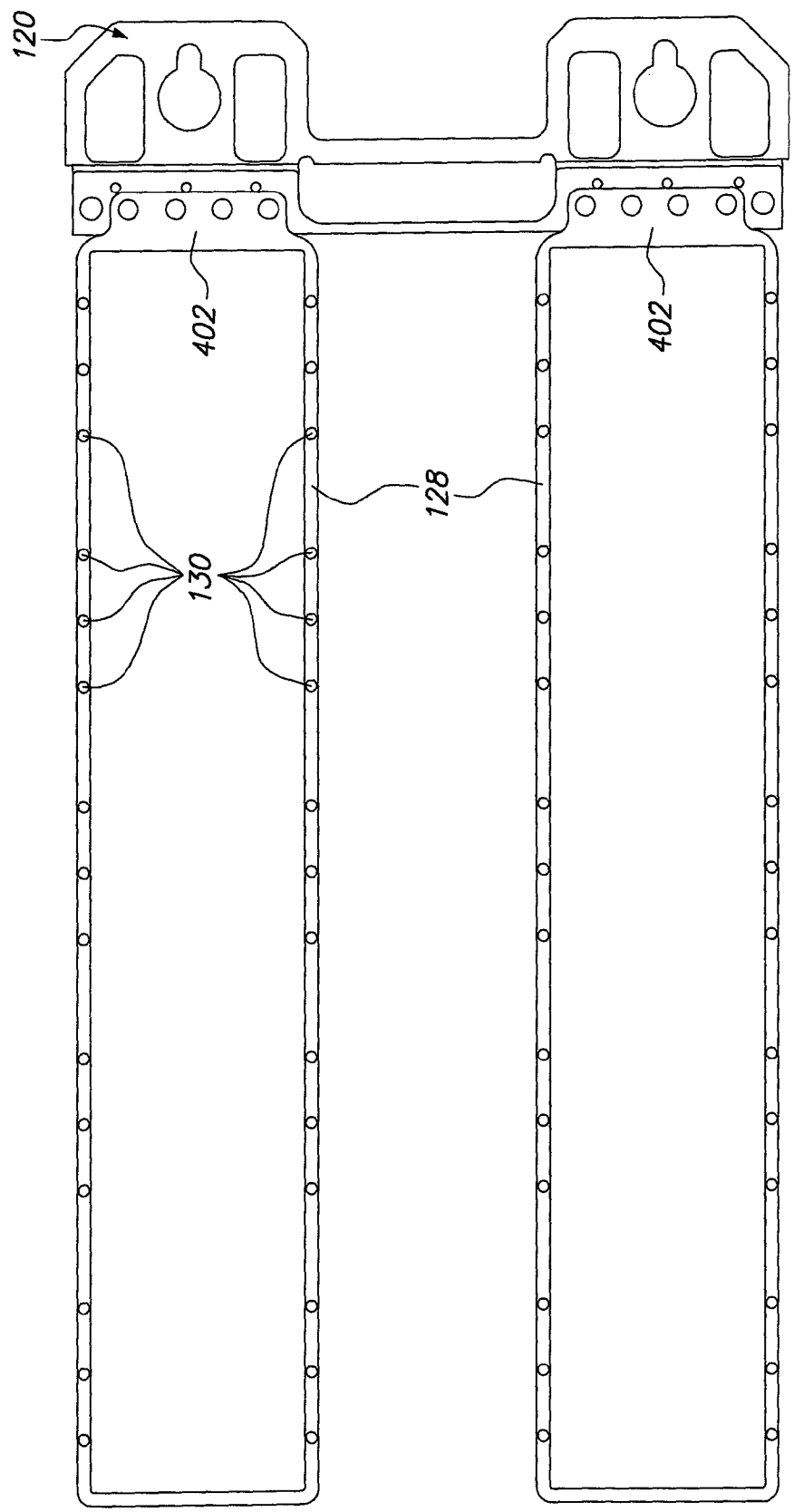
FIG. 4 is a planar view of a conductive assembly including an electrically-conductive bus bar and electrically-conductive lines in accordance with an embodiment of the invention.

FIG. 4 is a planar view of a conductive assembly (weldment) including an electrically-conductive bus bar 120 and metal lines 128 in accordance with an embodiment of the invention. As shown, metal clipping pins 130 are attached to the metal lines 128. As further shown, the metal lines 128 are attached to a connecting plate 402 which is used to connect the conductive bus bar 120 to the metal lines 128. In one embodiment, the bus bar 120 may be formed from stainless steel, and the metal lines 128 may comprise copper lines.

Figure 5A:
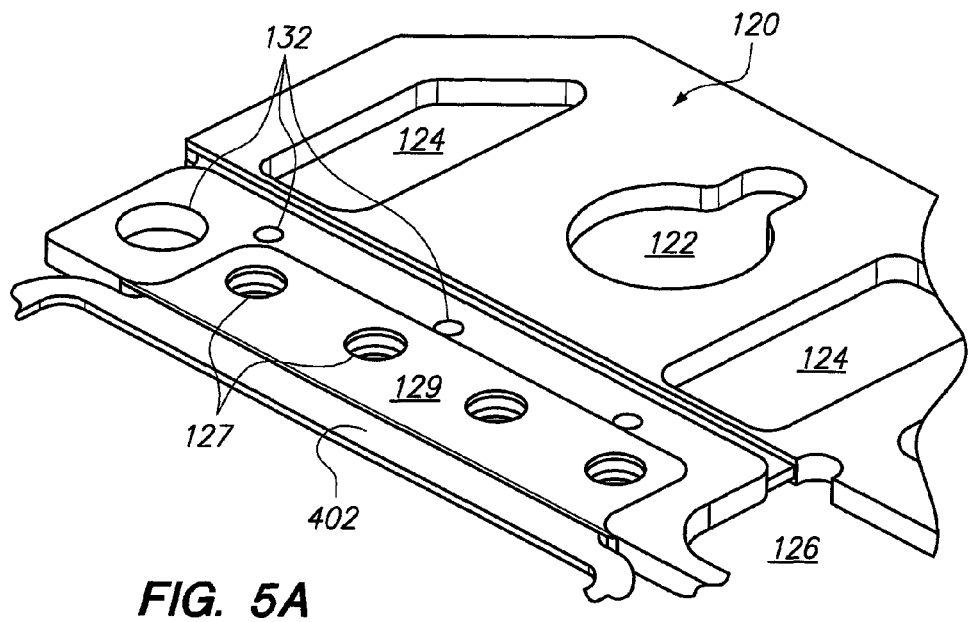
FIG. 5A is a first perspective view of a portion of the conductive assembly of FIG. 4 in accordance with an embodiment of the invention.
Figure 5B:
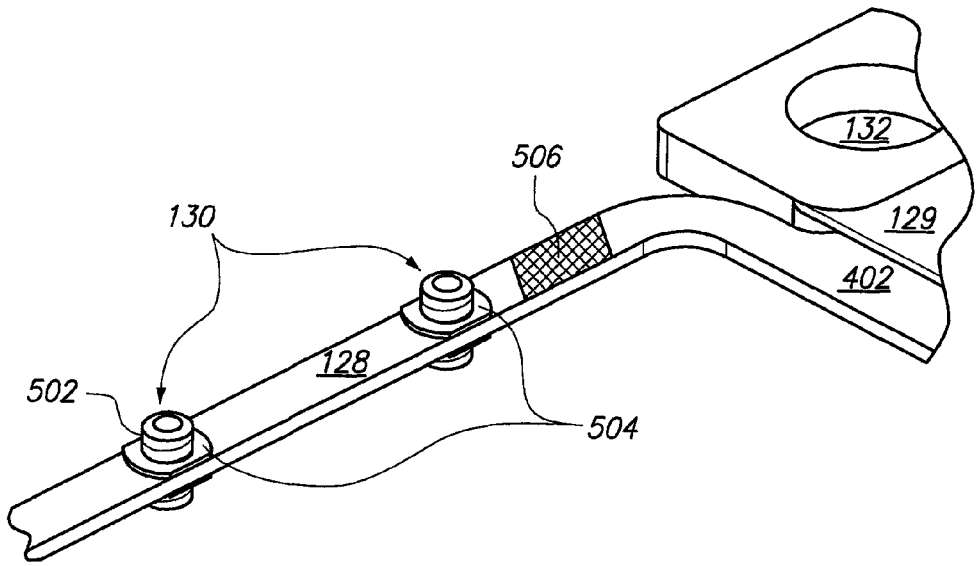
FIG. 5B is a second perspective view of a portion of the conductive assembly of FIG. 4 in accordance with an embodiment of the invention.

FIGS. 5A and 5B are two perspective views showing portions of the conductive assembly of FIG. 4 in accordance with an embodiment of the invention. As shown in FIG. 5A, the connecting plate 402 is sandwiched between two metal cover plates 129. Bushings may then be welded in the bushing holes 127 so as to electrically and mechanically connect the conductive bus bar 120 to the metal lines 120. The metal clipping pins 130 are attached in a permanent manner (for example, welded) to the metal lines 120. As shown in FIG. 5B, the metal clipping pins 130 may include a threaded outer surface 502. Furthermore, a thermoplastic layer (or overcoat) 504 may be deposited, for example, by injection molding, around the metal clipping pins 130 on the metal lines 128. In addition, a further thermoplastic layer (or overcoat) 506 may be deposited, for example, by dip coating or spray coating, over the metal lines 128. For ease of illustration, only a small segment of the metal lines 128 is shown with the thermoplastic layer 506 in FIG. 5B. However, the thermoplastic layer 506 may be coated over either a portion of, or an entirety of, the metal lines 128 in accordance with embodiments of the invention.

Figure 6:
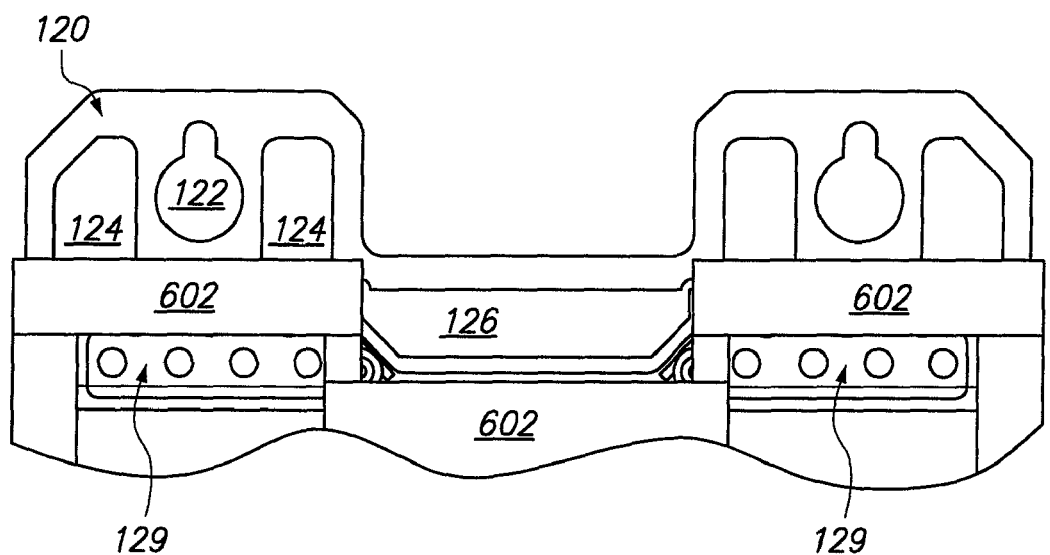
FIG. 6 is a planar view showing a thermoplastic overmold (or overcoat) applied to a portion the conductive bus bar in accordance with an embodiment of the invention.

FIG. 6 is a planar view showing a thermoplastic overmold (or overcoat) 602 applied to a portion the conductive bus bar 120 in accordance with an embodiment of the invention. As shown, the thermoplastic overmold 602 preferably spans a horizontal length of the conductive bus bar 120. In this exemplary configuration, the thermoplastic overmold 602 fills the bonding holes 132 the so as to bond securely to the conductive bus bar 120. The thermoplastic overmold 602 over select portions of the conductive bus bar 120 may be applied, for example, by injection molding.

Figure 7:
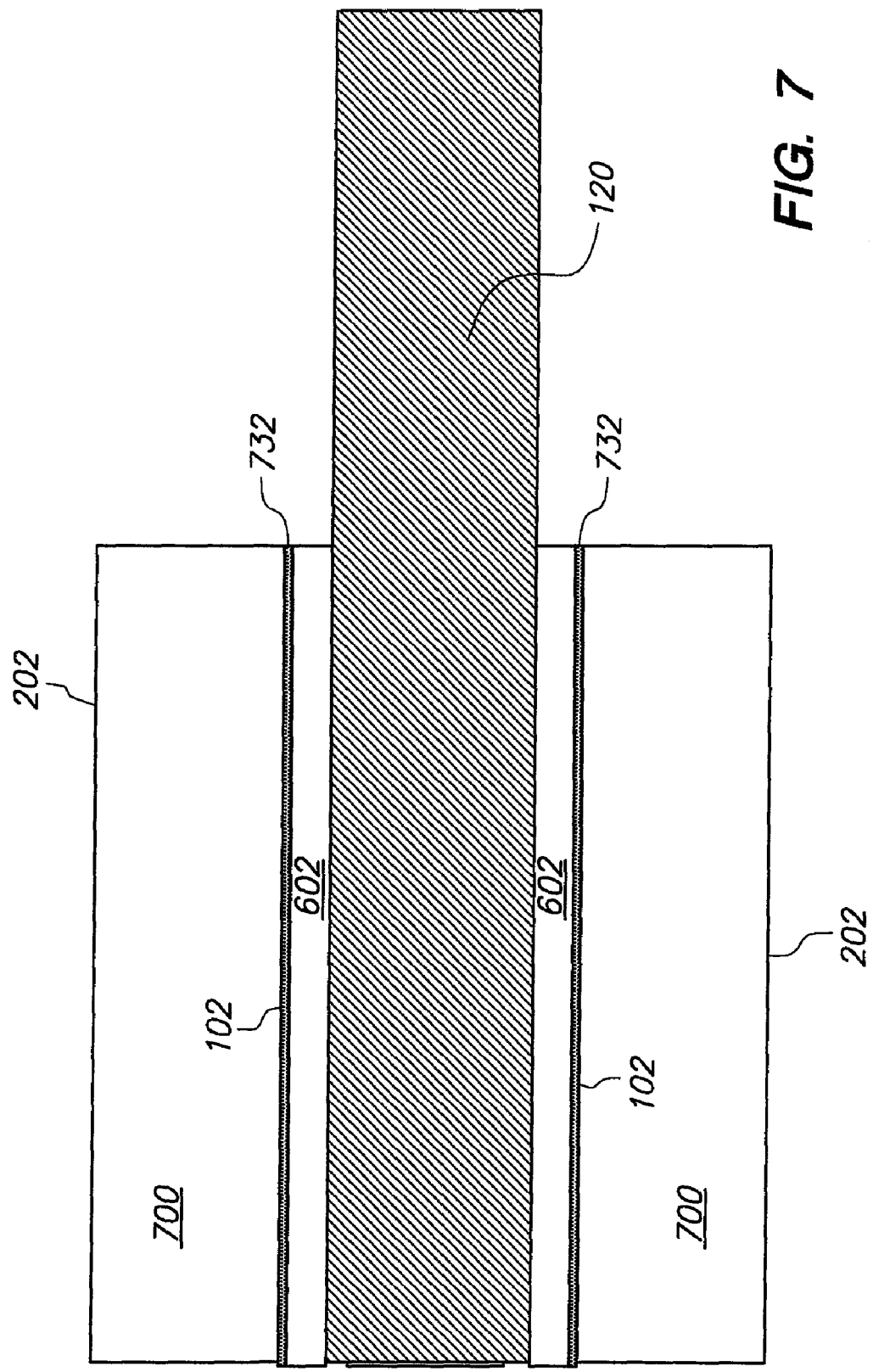
FIG. 7 is a cross-sectional view which depicts various layers in the bonding of two carrier plates and a conductive assembly in accordance with an embodiment of the invention.

FIG. 7 is a cross-sectional view which depicts various layers in the bonding of two carrier plates and a conductive assembly in accordance with an embodiment of the invention. Note that FIG. 7 is not to scale and depicts the various layers for purposes of explanation.

As shown, a lower portion of the conductive bus bar 120 is sandwiched between the inner faces 102 of the two non-conductive carrier plates 700. As shown, the thermoplastic overmold 602 covers both sides of the conductive bus bar 120. A solvent cement layer 732 may be used to form a plastic-to-plastic bond between the inner surfaces 102 of the non-conductive carrier plates 700 and the thermoplastic overcoat 602 on the conductive bus bar 120.

Figure 8:
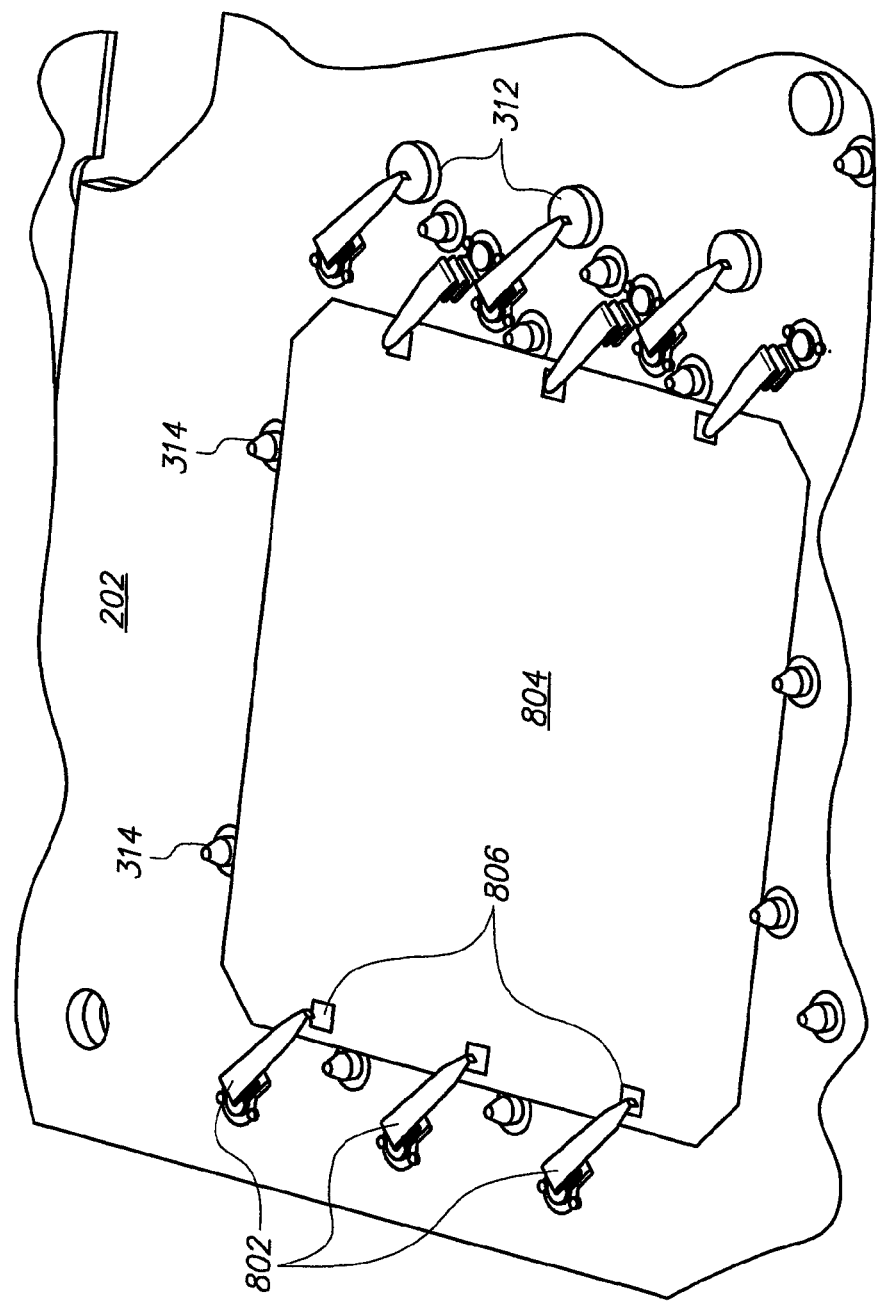
FIG. 8 is a perspective view depicting a semiconductor wafer clipped to a substrate carrier in accordance with an embodiment of the invention.

FIG. 8 is a perspective view depicting a semiconductor wafer 804 clipped to a substrate carrier in accordance with an embodiment of the invention. As shown, the wafer 804 may be placed in a space defined by alignment pegs 314 along its perimeter. Underneath the wafer 804 may be spaced from the outer face 202 of the carrier by a plurality of pads (for example, a center pad 311 and perimeter pads 312) (not shown). In this exemplary embodiment, electrically-conductive clips 802 are attached to the clip attachment features 210 on opposite sides of the wafer 804. When holding the wafer 804 to the carrier, each electrically-conductive clip 802 may be positioned so that its contact point rests on a metallic contact pad 806 on the surface of the wafer 804. In an exemplary embodiment, the wafer 804 is configured such that each contact pad 806 is located directly above one of the perimeter pads 312 so that the clip may press the wafer directly against the pad (see neighboring space for another wafer on the right).

Figure 9A:
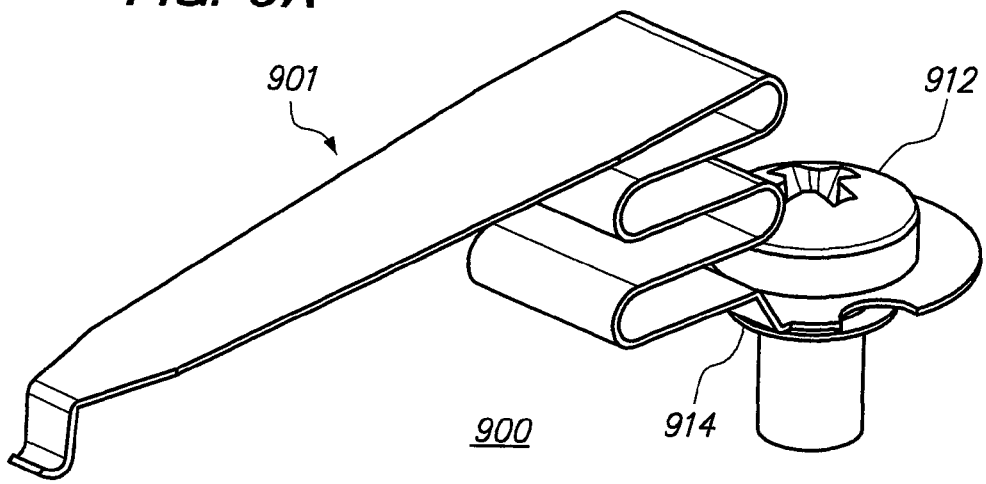
FIG. 9A is a perspective view of a first clip assembly in accordance with an embodiment of the invention.

FIG. 9A is a perspective view of a first clip assembly 900 in accordance with an embodiment of the invention. As shown, the first clip assembly 900 may include a clip 901, a screw 912 and an O-ring 914. In this exemplary embodiment, the clip 901 may be formed from a single stainless steel piece (SS 301 which is fully hardened, for example). In addition, the screw 912 may be threaded on the inside so that it may be screwed onto the outer thread 502 of the clip attachment pin 130.

Figure 9B:
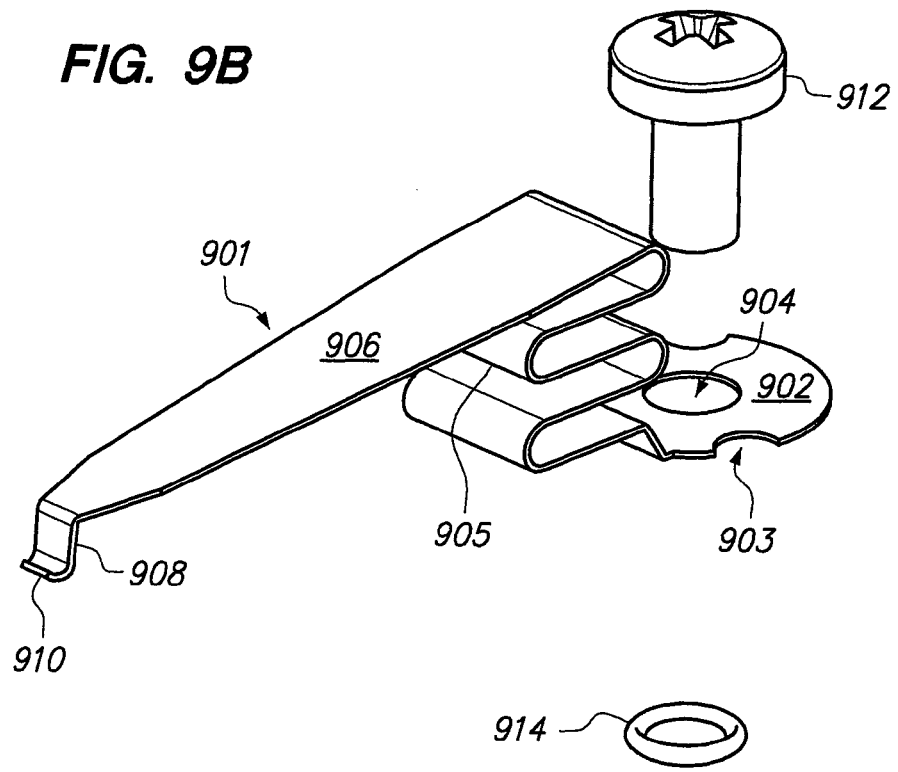
FIG. 9B is an exploded view showing the parts of the first clip assembly as separated.

FIG. 9B is an exploded view showing the parts of the first clip assembly 900 as separated. In addition, various features of the clip 901 are labeled. As seen, the clip 901 includes a base 902 with a hole 904. The clip attachment pin 130 fits through the O-ring 914 and the hole 904, and then the screw 912 may be screwed onto outer thread 502 of the clip attachment pin 130. The base 904 of the clip 901 may also include one or more alignment features 903 so as to provide for the correct angular orientation of the clip once it is attached.

As further shown, a spring 905 may extend upward from the base 902. In this case, the spring comprises folds of the metal which forms the clip. A clip arm 906 may start at the top of the spring 905 and extend away from the base 902. As seen, the arm 906 may be tapered in an exemplary embodiment to improve its lifetime. A tip portion 908 may extend downward from the end of the arm 906 which is furthest from the base 902. A contact feature 910 may be formed at the lowest point of the tip portion 908. The contact feature 910 is the part of the clip 901 which makes physical contact with the substrate to be plated (for example, at the contact pads 806 on a surface of a semiconductor wafer). In one implementation, the contact feature 910 is approximately 1 mm wide.

Figure 10A:
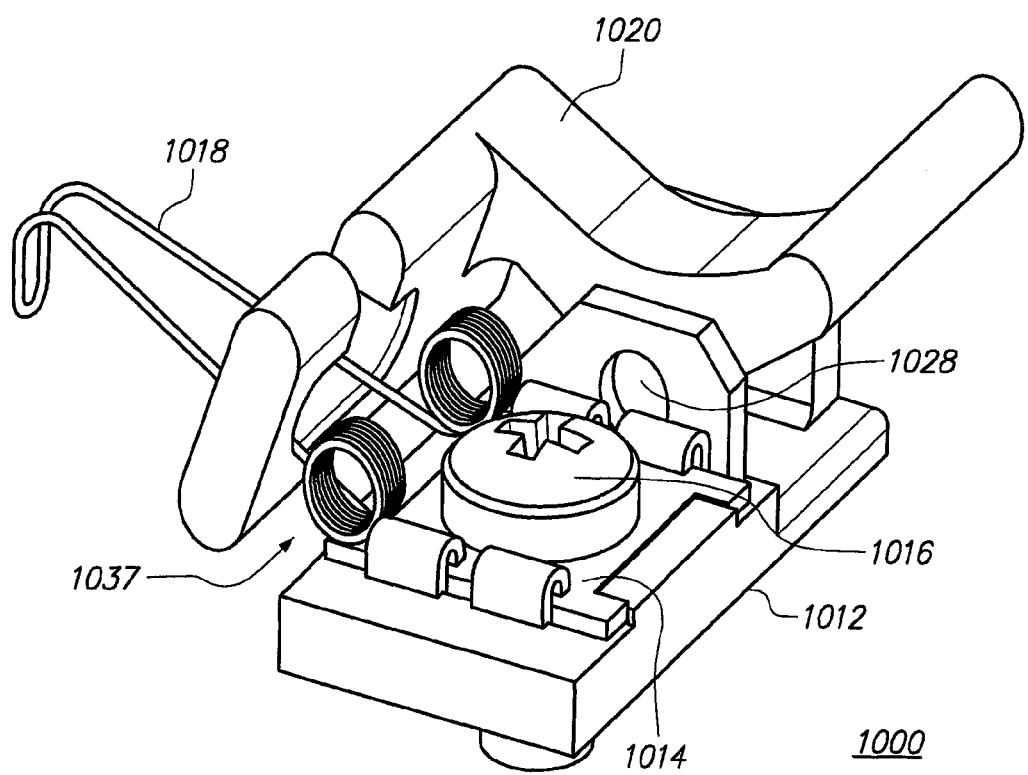
FIG. 10A is a perspective view of a second clip assembly in accordance with an embodiment of the invention.
Figure 10B:
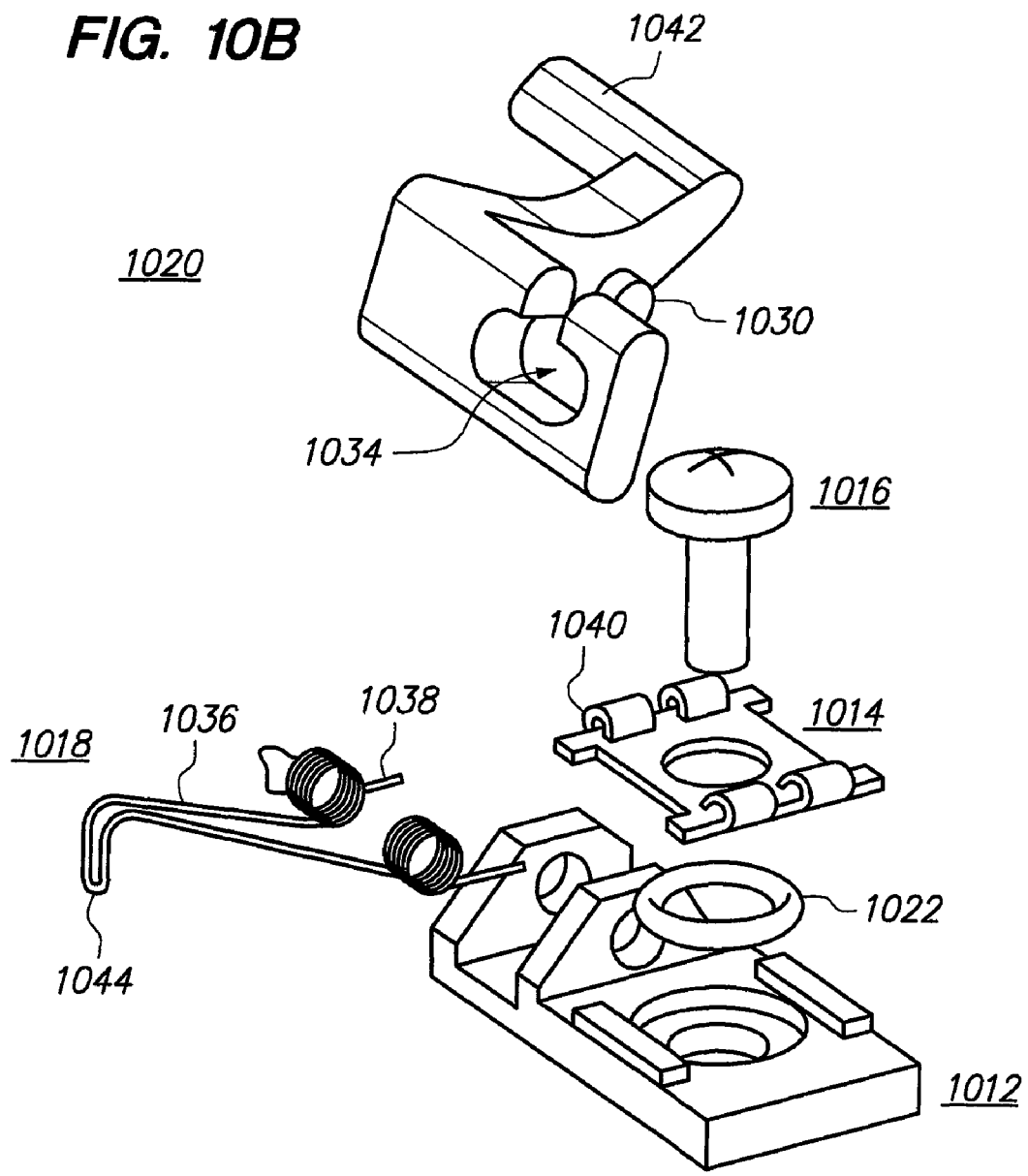
FIG. 10B is an exploded view showing the parts of the second clip assembly as separated.

FIG. 10A is a perspective view of a second clip assembly 1000 in accordance with an embodiment of the invention. In this exemplary embodiment, the second clip assembly 1000 may include both metal and plastic parts. FIG. 10B is an exploded view showing parts of the second clip assembly 1000 as separated. As shown, the second clip assembly may a plastic base 1012, a metal spring-attachment plate 1014, a metal screw 1016, a metal double-torsion spring-loaded clip 1018, a plastic lever 1020, and a rubber O-ring 1022.

The screw 1016 includes a shaft which fits through an opening of the spring attachment plate 1014, the O-ring 1022, and through an opening in the base 1012. In an exemplary implementation, the shaft 1042 may be threaded internally so as to be screwed onto an outer thread 502 of a metal clipping pin 130. The lever 1020 is also attached to the base 1020 using features 1030.

Wire ends 1038 at a base of the spring-loaded clip 1018 fit into ferrule features 1040 on the spring attachment plate 1014. The arm 1036 of the spring-loaded clip 1018 fits through an opening 1034 in the lever 1020. When the arm 1042 of the lever 102 is pressed down, the arm 1036 of the clip 1018 is raised. When the arm 1042 of the lever 102 is released, the arm 1036 of the clip 1018 is lowered.

The shaft of the screw 1016 may pass through the O-ring 1022, a hole in the spring-attachment plate 1014, and a hole in the base 1012. The shaft of the screw 1016 may have an inner thread which screws onto the outer thread of the clip attachment pin 130 so as to attach the base 1012 to the outside face 202 of the non-conductive carrier plate. The O-ring 1022 may fit into a recessed ring surrounding the hole in the base 1012 so as to prevent the electrolytic solution of the plating bath from reaching to the clip attachment pin 130.

The spring-loaded clip 1018 may be made of stainless steel (SS 301, for example) and may include wire ends 1038 that fit into ferrules 1040 of the spring-attachment plate 1014. The spring-loaded clip 1018 may further include an arm 1036 that may be squeezed so as to fit in and through a spring hole 1034 in the lever 1020. The spring opening 1034 may provide dual functionalities of protecting the spring coils 1037 and limiting the right-to-left and left-to-right movements of the arm 1036. The lever 1020 may include male rotatable attachment features 1030 that fit into corresponding female rotatable attachment features 1028 of the base 1012. The male rotatable attachment features 1030 thus form a pivot shaft for pivotally mounting the lever 1020.

Figure 10C:
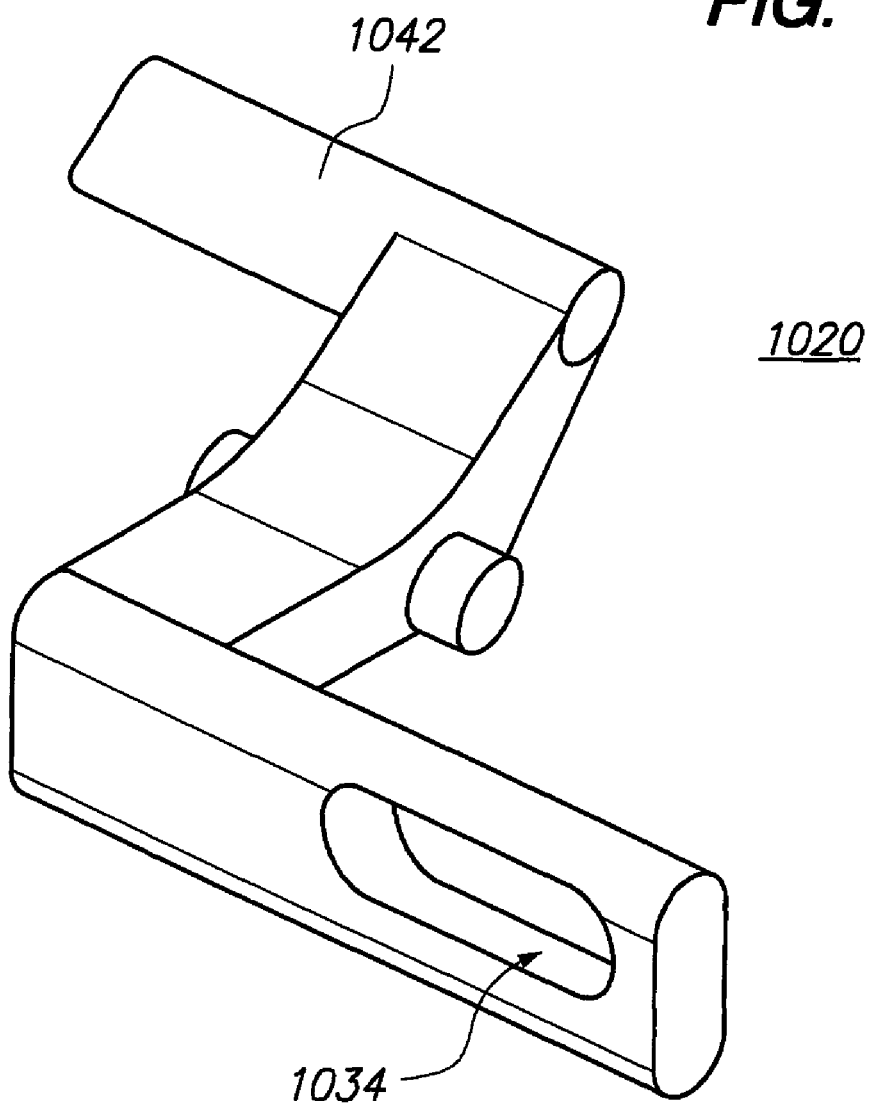
FIG. 10C further illustrates the Z shape of the lever.

The lever (actuating arm) 1020 may be formed in a "Z" shape. The Z shape is illustrated in FIG. 10C. The Z shape of the lever 1020 advantageously allows for a wide window for opening the clips, particularly when they are arranged into a double-clip assembly 1100 as described below in relation to FIG. 11.

When the clip assembly 1000 is attached to the clip attachment pin 130, a handle 1042 of the lever 1020 may be pressed down to open (disengage) the clip by lifting up the arm of the spring-loaded clip 1018 and so raise the contact feature 1044 at its tip. Releasing the handle 1042 of the lever 1020 causes the clip to close (engage) by lowering the arm of the spring-loaded clip 1018 so that the contact feature 1044 exerts a downward force to hold in place the substrate to be plated.

In accordance with an embodiment of the invention, the clip assembly 1000 forms an electrically-conductive path from the metal clipping pins 130 to the substrate to be electroplated. In one implementation, the screw 1016, the spring-attachment plate 1014 and the clip 1018 are each metallic so as to form the electrically-conductive path from the metal clipping pins 130 to the substrate to be electroplated.

Figure 11:
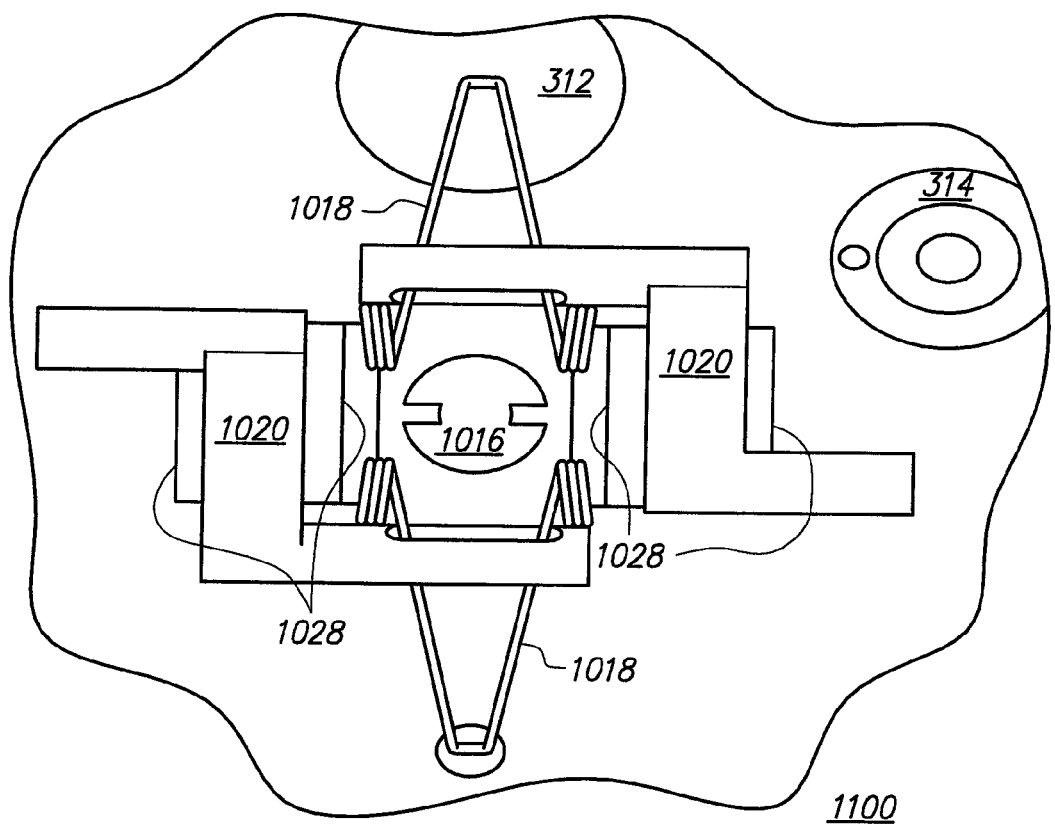
FIG. 11 is a top view showing a double-clip assembly in accordance with an embodiment of the invention.

FIG. 11 is a top view showing a double-clip assembly 1100 in accordance with an embodiment of the invention. Such a double-clip assembly 1100 is preferably attached to the clip attachment features 210 which are located between two substrate holding areas 213. As shown, in this embodiment, the base 1012 is configured with two sets of female rotatable attachment features 1028 (one set to the left of the screw 1016 and one set to the right of the screw 1016) such that two levers 1020 may be pivotally mounted to the base 1012. Two spring arms 1018 are attached by inserting their wire ends 1038 into two sets of ferrules 1040 on the spring-attachment plate 1014 and by squeezing them into the spring holes 1034 of the levers 1020. One spring arm 1018 is oriented with its tip portion is over a first substrate holding area 213 towards the top of the diagram, and the other spring arm 1018 is oriented with its tip is over a second substrate holding area 213 towards the bottom of the diagram.

In accordance with an embodiment of the invention, a robotic machine may be configured to open all the clips surrounding each substrate holding area 213 and a wafer (or other substrate to be processed) may be placed therein. The opening of the clips may be accomplished by simultaneously pressing down on the handles 1042 to raise the arms of the corresponding spring-loaded clips 1018. The clips surrounding each substrate holding area 213 may then be closed by the robotic machine releasing the handles 1042 to lower the arms of the corresponding spring-loaded clips 1018 such that the contact features 1044 press against the metallic contact pads 806 to hold the wafer (or other substrate or other substrate to be plated) firmly in place. Once all the wafers (or other substrates) to be processed have been thus loaded onto the carrier, then the plating and other processing may be performed. After the processing, a robotic machine may be configured to re-open all the clips surrounding each substrate holding area 213 so that the processed wafers (or other substrates) may be removed and replaced with wafers to be subsequently processed.

Figure 12:
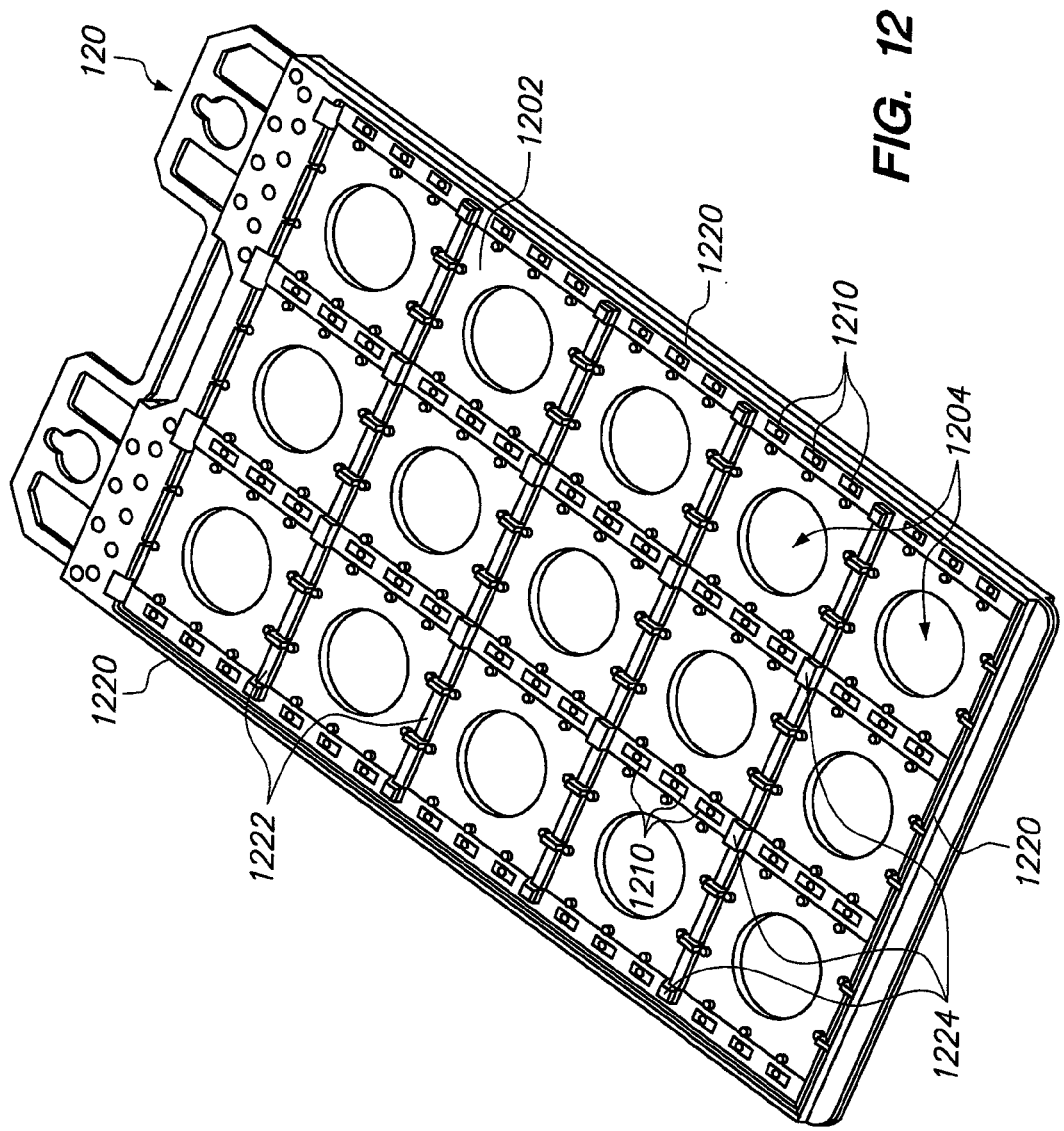
FIG. 12 is a perspective view of an outer face on one side of a permeable substrate carrier in accordance with an embodiment of the invention.

FIG. 12 is a perspective view of an outer face 1202 on one side of a permeable substrate carrier in accordance with an embodiment of the invention. In this alternate embodiment, the two plates forming each substrate carrier each include at least one opening for each substrate holding area. The embodiment illustrated has one large opening 1204 at the center of each substrate holding area. As shown, the openings 1204 may be circular, for example. The openings 1204 reduce the weight of the carrier body and allows rinsing solution to flow through (permeate) the carrier body. Applicants believe that the openings 1204 reduce a drag force when the carrier is removed from a bath.

The conductive assembly (weldment) including the electrically-conductive bus bar 120 at the top of the carrier and conductive lines 128 going from the bus bar 120 towards the bottom of the carrier may be the same as, or similar to, the conductive assembly described above in relation to FIGS. 4, 5A, 5B, 6 and 7.

Further shown in FIG. 12 are clip attachment features 1210 on left and right sides of each opening 1204. Electrically-conductive clips are preferably attached to the clip attachment features 1210. The electrically-conductive clips may be the same as, or similar to, the clip assembly 900 described above in relation to FIGS. 9A and 9B, or the clip assemblies (1000 and 1100) described above in relation to FIGS. 10A, 10B, 10C and 11.

In addition, FIG. 12 shows support ribs 1220 on the left, bottom, and right sides of the carrier body. These support ribs 1220 provide structural strength to the carrier body. In accordance with an embodiment of the invention, the support ribs 1220 have a tapered profile to advantageously facilitate non-retention of electrolyte solution.

Also shown in FIG. 12 are horizontal support bars 1222. The horizontal support bars 1222 may be configured between rows of the openings 1204 to provide additional structural strength to the carrier body. In accordance with an embodiment of the invention, the raised horizontal support bars 1222 have a tapered profile to advantageously facilitate non-retention of electrolyte solution.

In addition, FIG. 12 shows a plurality of stacking features 1224 on the carrier body. In one implementation, the stacking features 1224 may be arranged periodically along the horizontal support bars 1222. The stacking features 1224 are configured so as to maintain alignment and separation between carrier bodies when they are stacked.

Figure 13:
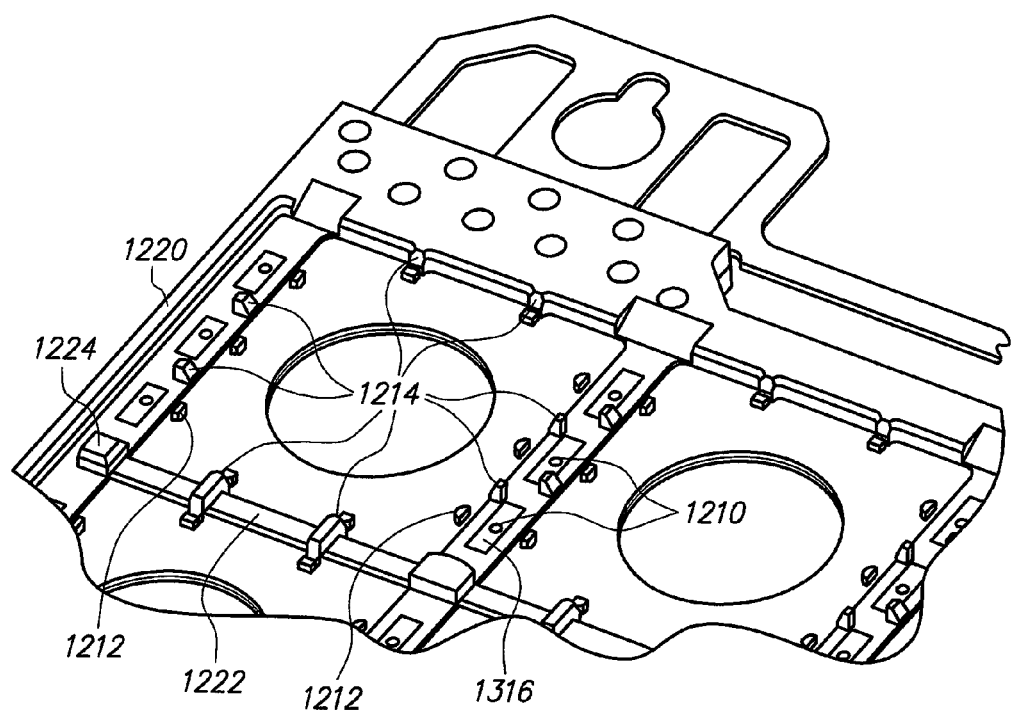
FIG. 13 is a closer-up perspective view of a portion of the permeable substrate carrier of FIG. 12 in accordance with an embodiment of the invention.

FIG. 13 is a closer-up perspective view of a portion of the permeable substrate carrier of FIG. 12 in accordance with an embodiment of the invention. As shown, each side surrounding an opening 1204 includes substrate alignment features 1314. The substrate alignment features 1314 are positioned around the opening 1204 and are configured such that the wafer (or other substrate) to be plated fits within a region having these substrate alignment features 1314 at its perimeter.

As further shown, there are several spacing features 1312 positioned around the opening 1204. The spacing features 1312 are positioned to lie underneath the wafer or other substrate to be plated when it is clipped to the substrate carrier. The spacing features 1312 provides a space or gap between the substrate and the carrier.

In addition, FIG. 13 depicts relief cuts 1316 surrounding the clip attachment features 1210. These relief cuts 1316 are recessed areas that facilitate proper positioning of a base of a clip assembly (for example, see base 1012 of clip assembly 1000 shown in FIGS. 10A and 10B).

Figure 14:
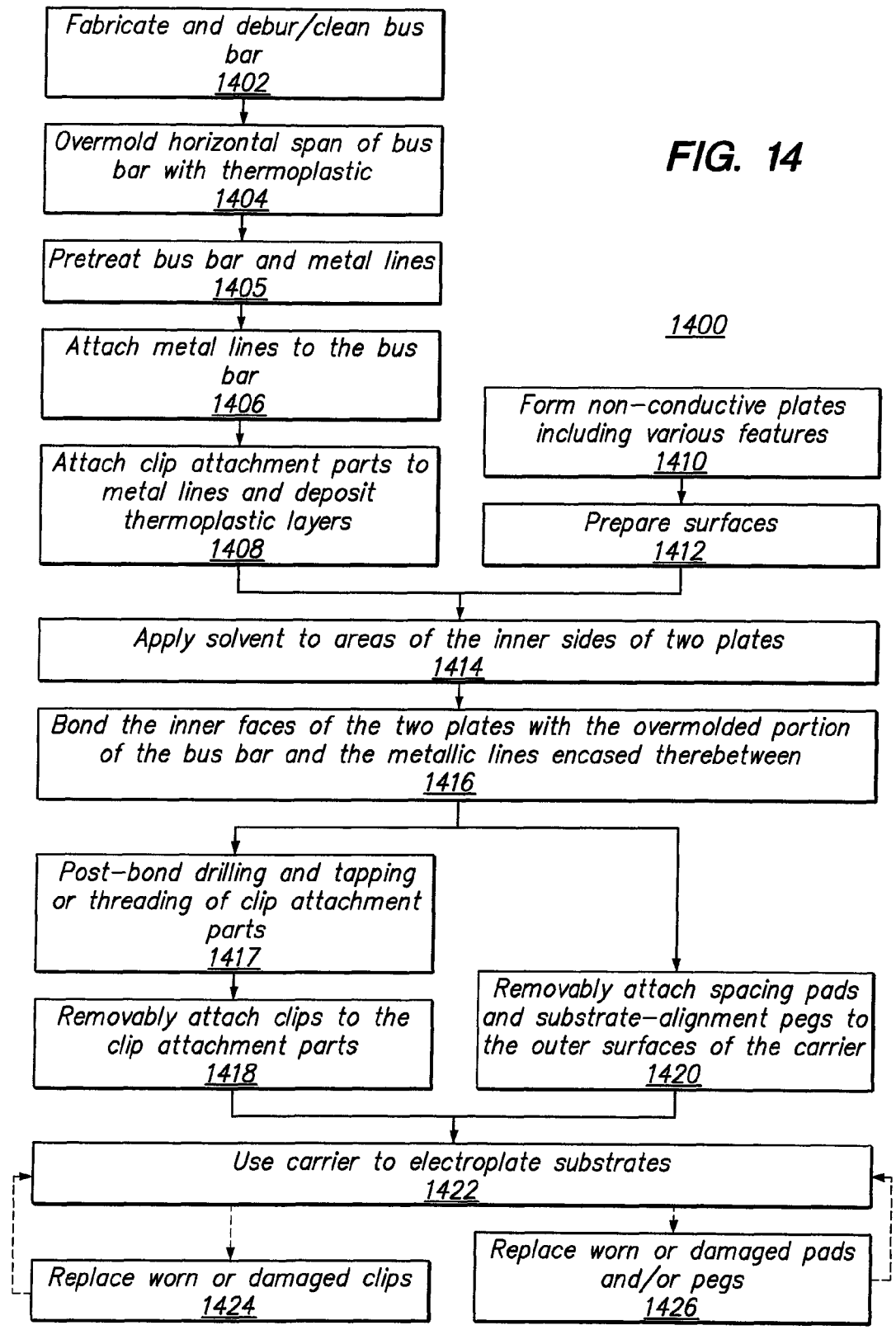
FIG. 14 is a flow chart of a method of manufacturing and maintaining a single-piece substrate carrier for electroplating in accordance with an embodiment of the invention.

FIG. 14 is a flow chart of a method 1400 of manufacturing and maintaining a single-piece substrate carrier for electroplating in accordance with an embodiment of the invention. The single-piece substrate carrier is substantially more robust when compared against a prior multiple-piece substrate carrier.

Blocks 1402 through 1408 pertain to the manufacture of a conductive assembly. The conductive assembly may be, for example, configured as the conductive assembly (weldment) described above in relation to FIG. 4.

In block 1402, an electrically-conductive bus bar is fabricated. In one example, the bus bar may be fabricated by machining a 6 millimeter thick stainless steel (SS 316, for example) bar to a shape with openings such as described above in relation to the bus bar 120 shown in FIG. 1. After machining, the bus bar may be deburred and cleaned.

In block 1404, a portion of the bus bar spanning its horizontal length is overmolded or overcoated with a thermoplastic. The overmolding or overcoating may be performed, for example, by injection molding chlorinated polyvinyl chloride (CPVC) over a lower portion of the bus bar. In one example, the thermoplastic overcoat may be formed over an area of the bus bar such as the area 602 shown in FIG. 6.

In block 1405, the bus bar and metal lines may be pre-treated prior to being conductively attached together. The pre-treatment may comprise degreasing with sand blasting and/or using a grit cloth to remove surface deposits and may also comprise cleaning with multiple washes and air drying. The pre-treatment may also include pre-treating with chemicals to promote adhesion between the bus bar (stainless steel, for example) and the metal lines (copper, for example).

In block 1406, metal lines are conductively attached to the bus bar. This may be accomplished, for example, by welding the metal lines (for example, copper) to the bus bar (for example, stainless steel). In one example, the metal lines may be configured similarly to the configuration of metal lines 128 shown in FIG. 4.

In block 1408, clip-attachment parts are conductively attached to the metal lines, and thermoplastic layers may be deposited. The thermoplastic layers may include, for example, a thermoplastic layer (see 504 in FIG. 5B) surrounding each clip-attachment parts and a thermoplastic layer (see 506 in FIG. 5B) over the metal lines.

Blocks 1410 and 1412 pertain to the manufacture of the non-conductive plates for the carrier body. In one embodiment, the non-conductive plates may be formed from CPVC material. Other embodiments may use different thermoplastic materials.

In block 1410, two non-conductive plates are formed with various features for the carrier body. In a first embodiment, the carrier body is designed to be non-permeable to electrolytic solution and may comprise non-conductive plates with an inner face 102 as shown in FIG. 1 and an outer face 202 as shown in FIG. 2. In this embodiment, although holes are formed through the plates for the clip attachment parts, the thermoplastic layer around the clip attachment parts are bonded to the inner face of the non-conductive plate to maintain the non-permeable aspect of the carrier body. In a second embodiment, the carrier body is designed to be permeable to electrolytic solution and may be configured with large circular openings 1204 as shown in FIG. 12.

In block 1412, the surfaces of the plates are prepared prior to bonding. For example, the surfaces may be sand blasted and then cleaned with multiple washes and air drying.

Blocks 1414 through 1416 pertain to the integration of the conductive assembly and the carrier plates to form a single-piece substrate carrier. In block 1414, a solvent cement is applied to areas of the inner faces of the two plates. In the plates are made of CPVC, then an exemplary solvent cement may be a CPVC solvent cement, such as, for instance, Weld-On® 724™ solvent cement.

In block 1416, the inner sides of the two plates are bonded with the overmolded portion of the bus bar and the metal lines encased therebetween. The positioning of the bus bar and the metal lines against an inner face of one of the plates is depicted in FIG. 1, for example. The bonding process may involve, for example: application of a primer to the inner faces of the plates; application of a gum material on the areas of the inner faces where the metal lines are to be embedded; embedding the metal lines within the gum material; bonding the inner faces of the two plates; and curing the bonded plates (for example, for 72 hours).

Blocks 1417 and 1420 pertain to adding the clips, pads and pegs onto the outer faces of the carrier plates.

In block 1417, post-bond drilling for the clip-attachment parts and tapping or threading of the clip-attachment parts are performed. Thereafter, in block 1418, clips to hold the substrates to the carrier may be attached in a removable manner to the clip attachment features at the outer faces of the carrier. Because the clips are removably attached, they may be readily replaced when worn or damaged. In one embodiment, the clips may comprise clip assemblies 900 such as those depicted in FIGS. 9A and 9B. In another embodiment, the clips may comprise single clips on the edges of the carrier and double clips on the interior of the carrier (where the double clips are between two substrate holding areas). The single clips may comprise, for example, the clip assembly 1000 depicted in FIGS. 10A, 10B. The double clips may comprise, for example, the clip assembly 1100 depicted in FIG. 11.

In block 1420, spacing pads and substrate-alignment pegs may be removably attached onto the outer faces of the carrier plates. Because the pads and pegs are removably attached, they may be readily replaced when worn or damaged. The spacing pads may be removably attached to the pad attachment points (211 and 212) at the outer faces 202 of the carrier. In one embodiment, the spacing pads may comprise the pads (311 and 312) depicted in FIG. 3. The substrate-alignment pegs may be removably attached to the alignment peg attachment points 214 at the outer faces 202 of the carrier.

Blocks 1422 and 1426 pertain to maintaining the substrate carrier. In block 1422, the carrier is used to electroplate substrates. Use of the carrier typically involves dipping the carrier with the substrates clipped thereon into one or more electroplating baths while a voltage is applied to the substrates by way of the clips. See the method 1500 described below in relation to FIG. 15, for example.

Upon occasion, the clips may become worn or damaged. In accordance with an embodiment of the invention, the worn or damaged clips may be readily replaced per block 1424. In one implementation, the replacement of the clips may be performed on a periodic schedule. This advantageously allows the carrier to be kept in service without the substantial downtime needed to repair more permanently attached clips.

Similarly, upon occasion, the spacing pads and/or alignment pegs may become worn or damaged. In accordance with an embodiment of the invention, the worn or damaged pads and/or pegs may be readily replaced per block 1426. In one implementation, the replacement of the pads and/or pegs may be performed on a periodic schedule. This advantageously allows the carrier to be kept in service without the substantial downtime needed to repair more permanently attached pads and/or pegs.

Figure 15:
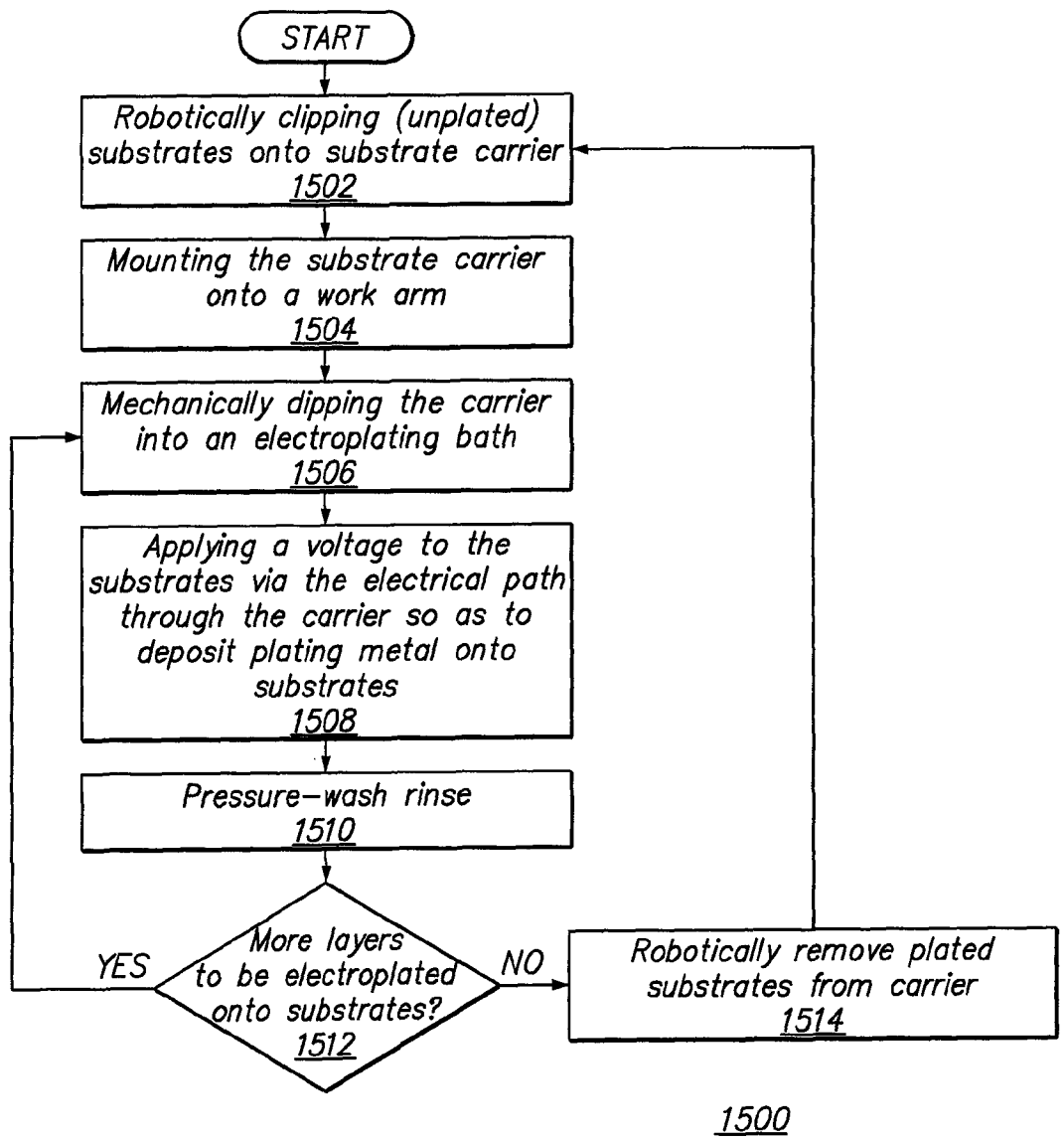
FIG. 15 is a flow chart of a method of using the carrier to electroplate a plurality of substrates in accordance with an embodiment of the invention.

FIG. 15 is a flow chart of a method 1500 of using a substrate carrier to electroplate a plurality of substrates in accordance with an embodiment of the invention. In block 1502, a robotic loader may be used to clip a plurality of substrates to the substrate holding areas of the carrier. In block 1504, the substrate carrier may be mounted on a work arm of an electroplating machine.

In block 1506, the electroplating machine may mechanically dip the carrier into an electroplating bath. Per block 1508, a voltage may be applied to the substrates by way of the electrically-conductive path traveling through the bus bar, the metal lines, and the clips. In one example, the substrates may comprise silicon wafers. The clips may make contact, for example, with a base (seed) layer of copper (or other metal) in gridlines on the surface of the wafers. A metal layer may then be deposited from the electroplating bath on top of the base layer.

Per block 1512, if more metal layers are to be electroplated onto the substrates, then the method 1500 may loop back to block 1506 and the carrier may be mechanically dipped into a different electroplating bath to deposit a different metal layer so as to form a multi-layer stack for a metal contact, for example. When no more metal layers are to be electroplated onto the substrates, then per block 1514 the substrates may be removed from the carrier by a robotic machine, for example.

Thereafter, the method 1500 may loop back to block 1502 and other (unplated) substrates to be processed may be robotically clipped onto the substrate carrier.

While at least one exemplary embodiment has been presented in the foregoing detailed description, it should be appreciated that a number of variations exist. It should also be appreciated that the exemplary embodiment or embodiments described herein are not intended to unnecessarily limit the scope, applicability, or configuration of the claimed subject matter. Rather, the foregoing detailed description will provide those skilled in the art with a convenient road map for implementing the described embodiment or embodiments. It should be understood that various changes can be made in the design and arrangement of elements without departing from the scope defined by the claims, which includes known equivalents and foreseeable equivalents at the time of filing this patent application.

What is claimed is:

1. A substrate carrier for use in electroplating a plurality of substrates, the carrier comprising:
    a non-conductive carrier body on which the substrates are placed;
    conductive lines embedded within the carrier body;
    a plurality of conductive clip attachment parts, the clip attachment parts being attached in a permanent manner to the conductive lines embedded within the carrier body; and
    a plurality of contact clips attached in a removable manner to the clip attachment parts, the contact clips holding the substrates in place and conductively connecting the substrates with the conductive lines.

2. The substrate carrier of claim 1, wherein a contact clip includes:
    a base of the contact clip;
    a hole in the base which is aligned with a clip attachment part of the substrate carrier;
    an O-ring arranged between the base of the contact clip and the carrier body; and
    a connecting screw going through said hole in the base and through said O-ring so as to attach the base to the clip attachment part and compress the O-ring.

3. The substrate carrier of claim 1, wherein the contact clip further includes:
    a spring coupled to the plate;
    an arm coupled to the spring; and
    a tip coupled to the arm, wherein the tip makes contact with the substrate being held by the clip.

4. The substrate carrier of claim 3, wherein the spring of the contact clip comprises multiple bends of metal.

5. The substrate carrier of claim 3, wherein the arm of the contact clip comprises a tapered metal plate which is narrower towards the tip portion.

6. The substrate carrier of claim 3, wherein a single piece of metal is used to form the base, the spring and the arm of the contact clip.

7. The substrate carrier of claim 6, wherein the single piece of metal comprises a stainless steel.

8. The substrate carrier of claim 1, wherein a contact clip comprises:
    a base of the contact clip;
    a hole in the base which is aligned with a clip attachment part of the substrate carrier;
    a spring-attachment plate of the contact clip;
    a hole in the plate which is aligned with the hole in the base; and
    a connecting screw going through said holes and being screwed onto the clip attachment part so as to attach the base and the plate to the carrier body.

9. The substrate carrier of claim 8, wherein the contact clip further comprises:
    an O-ring which has a hole which is aligned between said holes of the base and the plate and which is compressed between the base and the plate.

10. The substrate carrier of claim 9, wherein the contact clip further comprises:
    a torsion spring mechanically coupled to the plate; and
    a lever mechanically coupled to both the plate and the spring.

11. The substrate carrier of claim 10, wherein the base and the lever are plastic parts, and wherein the screw, the plate, and the spring are metal parts.

12. The substrate carrier of claim 10, wherein pressing down on a handle of the lever causes an arm of the spring to lift away from a surface of the carrier body.

13. The substrate carrier of claim 1, further comprising:
    a plurality of spacers on the carrier body, the spacers being configured to space the substrates from a surface of the carrier body when the substrates are clipped onto the carrier.

14. The substrate carrier of claim 1, further comprising:
    a plurality of aligning features on the carrier body, wherein the aligning features are arranged to align the substrates clipped onto the carrier into substrate holding areas and to protect the contact clips from the substrates.

15. The substrate carrier of claim 14, wherein the aligning features comprise removable pegs.

16. The substrate carrier of claim 1, further comprising:
    an electrically conductive bus bar configured at a top side of the carrier body and conductively coupled to the conductive lines embedded in the carrier body, the electrically-conductive bus bar including a plurality of mounting holes for mounting the carrier onto a work arm for dipping the carrier body into, and raising the carrier body out of, an electroplating bath while a voltage is applied to the bus bar.

17. A method of electroplating substrates, the method comprising:
    clipping the substrates to a substrate carrier, the substrate carrier comprising a non-conductive carrier body on which the substrates are placed, conductive lines embedded within the carrier body, conductive clip attachment parts attached in a permanent manner to the conductive lines, and contact clips attached in a removable manner to the clip attachment parts;
    mounting the substrate carrier onto a mechanical arm;
    applying a voltage to the substrates via the contact clips; and
    dipping the substrate carrier with the substrates clipped thereon into an electroplating bath; and
    unclipping the substrates from the substrate carrier when the electroplating is complete.

18. The method of claim 17, wherein an automated apparatus is utilized to open the clips when the substrates are clipped to, or unclipped from, the substrate carrier.

19. The method of claim 17, further comprising:
    periodically replacing clips that are removably attached to the carrier body.

20. The method of claim 17, further comprising:
    periodically replacing spacers and aligning features that are removably attached to the carrier body.

* * * * *